United States Patent
Ferry

Patent Number: 5,431,584
Date of Patent: Jul. 11, 1995

[54] ELECTRICAL CONNECTOR WITH REDUCED CROSSTALK

[75] Inventor: Julian J. Ferry, Kernersville, N.C.

[73] Assignee: The Whitaker Corporation, Wilmington, Del.

[21] Appl. No.: 262,080

[22] Filed: Jun. 17, 1994

Related U.S. Application Data

[63] Continuation-in-part of Ser. No. 184,129, Jan. 21, 1994.

[51] Int. Cl.$^6$ ............................................ H01R 13/66
[52] U.S. Cl. ................................. 439/620; 333/182; 439/894
[58] Field of Search .................... 439/620, 894, 894.1; 333/181–185

[56] References Cited

U.S. PATENT DOCUMENTS

| | | | |
|---|---|---|---|
| 1,995,454 | 3/1935 | Hunter | 179/78 |
| 2,080,217 | 5/1937 | Weaver | 179/78 |
| 3,760,335 | 9/1973 | Roberts | 364/713.11 |
| 3,924,923 | 12/1975 | Shoemaker | 141/312 |
| 4,335,929 | 6/1982 | Abernethy | 439/358 |
| 4,643,509 | 2/1987 | Hollyday et al. | 439/620 |
| 4,653,838 | 3/1987 | Ney et al. | 439/620 |
| 4,723,115 | 2/1988 | Apter | 333/181 |
| 5,186,647 | 2/1993 | Denkmann et al. | 439/395 |

*Primary Examiner*—Gary F. Paumen
*Attorney, Agent, or Firm*—William B. Noll

[57] ABSTRACT

This invention is directed to an improved system for reducing crosstalk in an electrical connector, where a typical connector is a multi-contact electrical connector comprising a pair of intermatable connector members, where each connector member is adapted to be terminated to plural conductors. A typical connector comprises a housing formed of an insulative material having a conductor receiving side, a mating side, and a plurality of contact receiving cavities extending from the conductor receiving side to said mating side. The cavities are arranged in rows on a spaced-apart parallel axes, where adjacent rows are separated by an insulative housing wall. An array of electrical contact terminals are provided in the cavities. A preferred system hereof is the provision of an electronic device in the form of a thin dielectric film, having plural discrete electrically conductive traces along a first surface thereof, where the first surface is arranged adjacent the insulating wall underlying the contact terminals. By this arrangement capacitive coupling of energy between selected pairs of contact terminals is achieved.

7 Claims, 5 Drawing Sheets

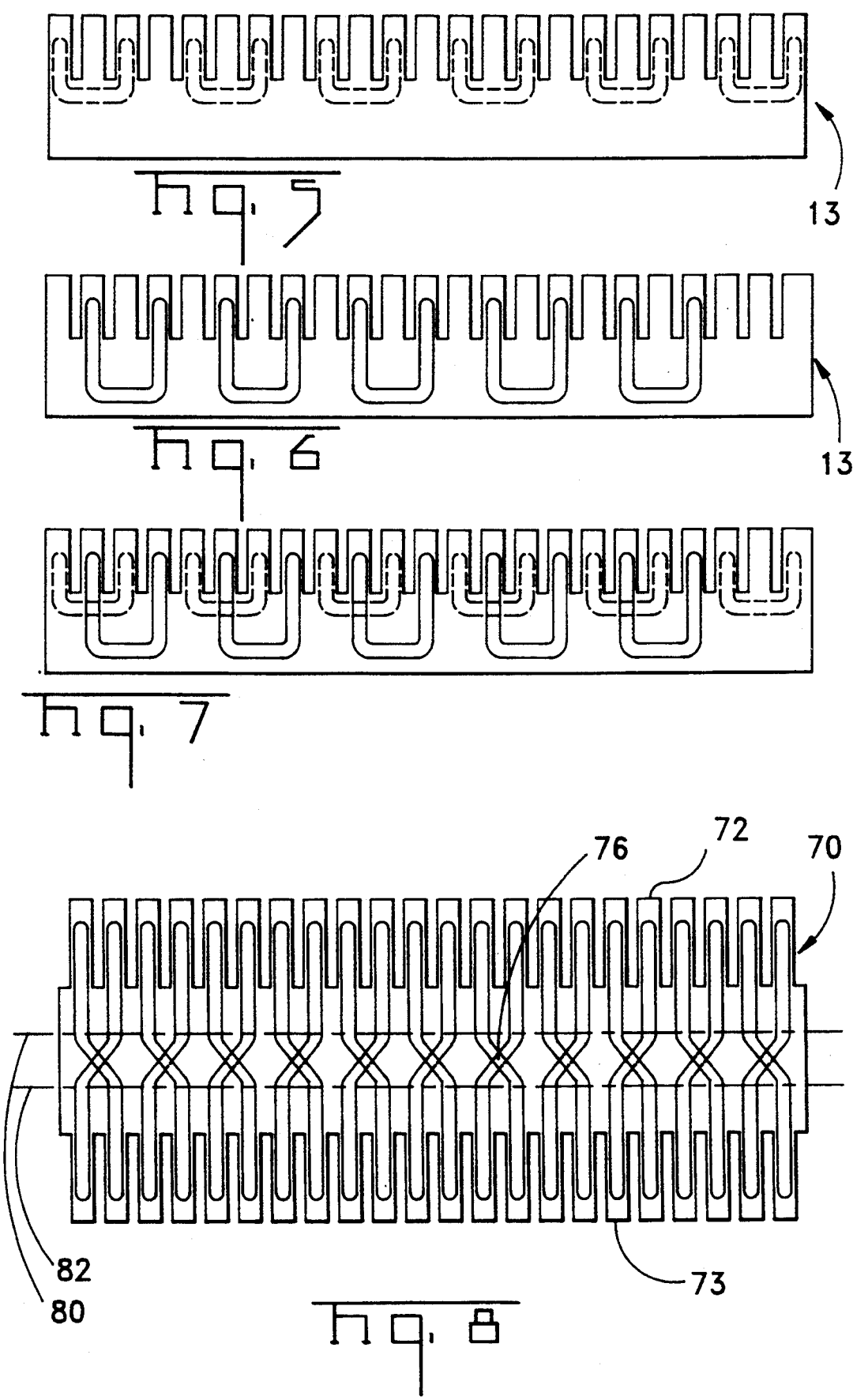

ELECTRICAL CONNECTOR WITH REDUCED CROSSTALK

RELATED APPLICATION

This application is a continuation-in-part of, and represents an improvement to, co-pending application, Ser. No. 08/184,129 filed Jan. 21, 1994, entitled "High Performance Electrical Connector", by the inventor hereof, where such application is incorporated herein by reference. The respective inventions are directed to electrical connectors that meet or exceed Category 5 requirements, namely, reduce crosstalk by using energy which is capacitively coupled through the use of an insert that is located in close proximity to the connector terminals. The manner by which this is accomplished by the respective invention will be apparent in the specification which follows.

BACKGROUND OF THE INVENTION

Crosstalk may be simply defined as that situation when two signal carrying circuits extend close together where the existence of signaling currents in one circuit will tend to set up corresponding currents in the other. With the present trend for increasing transmission rates of electrical connecting devices, there followed the increasing demand for improved performance, particularly in the reduction of crosstalk at frequencies up to 100 MHz. As a consequence of this demand, the Telecommunications Industry Association (TIA) in cooperation with the Electronic Industries Association (EIA) recently developed a proposed standard for Category 5 components, where the transmission requirements of such components are characterized up to 100 MHz and are typically intended for emerging applications with transmission rates up to 100 Mbps. The standard is preliminarily identified as TSB40, Aug. 1992. The invention hereof relates to the hardware, but it is important to note that the hardware is only one major element of a communication system, while another major component is the transmission cable. Thus, it is important to insure the use of the correct connecting component or hardware that is compatible with the transmission characteristics of the cable. Such cables are typically high performance unshielded twisted-pair (UTP) cables, the performance characteristics of which are covered by EIA/TIA bulletin TSB-36.

Returning now to the component aspect of a transmission system, one of the more important test parameters for high performance electrical connector hardware, i.e. Category 5, is Near-End Cross-Talk (NEXT) Loss. This may be further defined as a measure of signal coupling from one circuit to another within a connector and is derived from swept frequency voltage measurements on short lengths of 100-ohm twisted-pair test leads terminated to the connector under test. A balanced input signal is applied to a disturbing pair of the connector while the induced signal on the disturbed pair is measured at the near-end of the test leads. In other words, NEXT loss is the way describing the effects of signal coupling causing portions of the signal on one pair to appear on another pair as unwanted noise. In any case, the worst case NEXT loss, see values below in TABLE I, for any combination of disturbing and disturbed pairs is determined by the formula:

NEXT (F)$\geq$NEXT (16)−20 Log (F/16) where NEXT (16) is the minimum NEXT loss at 16 MHZ, F is frequency (in MHZ) in the range from 1 MHZ to the highest referenced frequency, and NEXT (F) is the performance at that frequency.

TABLE I

| UTP Connecting Hardware NEXT Loss Limits As Specified in EIA/TIA Document TSB-40 | |
|---|---|
| Frequency (MHz) | Category 5 (dB) |
| 1.0 | >65 |
| 4.0 | >65 |
| 8.0 | 62 |
| 10.0 | 60 |
| 16.0 | 56 |
| 20.0 | 54 |
| 25 | 52 |
| 31.25 | 50 |
| 62.5 | 44 |
| 100 | 40 |

While problems associated with crosstalk have been known for years, as evidenced by U.S. Pat. Nos. 1,995,454 and 2,080,217 a major concern has only recently come to the forefront by the current demands for improved performance and higher signal transmission qualities. A recent development is represented by U.S. Pat. No. 5,186,647 to Denkmann et al. A major objective of the patent is to reduce crosstalk between specific conductors in a connector. A preferred embodiment thereof is a panel mount modular jack which includes a pair of lead frames, each comprising four, flat elongated conductors. The lead frames are mounted on top of each other and their conductors are all generally parallel and close to each other throughout a portion of the length of the conductors. The claimed improvement in crosstalk performance is achieved by a selected crossover pattern of the conductors without electrical contact being made because of a reentrant bend in the conductors in the crossover region.

The present invention, like the companion copending application, achieves Category 5 performance by a significant reduction in crosstalk with capacitive coupling through non-ohmic contact. Such performance, and the manner by which it is achieved in the present invention, will become apparent in the description which follows, particularly when read in conjunction with the accompanying drawings.

SUMMARY OF THE INVENTION

The invention hereof relates to a high performance electrical connector which reduces crosstalk and yields improved signal transmission qualities that meet or exceed Category 5 requirements. An unmodified connector of the type contemplated by this invention is disclosed in U.S. Pat. No. 3,760,335. Such connector comprises a pair of intermatable connector members, where each of the connector members is adapted to be terminated to plural conductors. Each connector member comprises a housing formed of an insulative material with a conductor receiving side and mating side, and a plurality of contact receiving cavities extending from the conductor receiving side to the mating side. The cavities are arranged in rows on spaced-apart parallel axes, where adjacent rows are typically separated by an insulative housing wall. An array of electrical contact terminals are disposed within the cavities, where each of the contact terminals includes contact means at its forward end proximate to the mating side, and conductor terminating means proximate to the conductor receiving side. The improved feature of this invention is the provision of the use of a flexible film, having a pattern of discrete electrical circuit traces along a first surface thereof, where the flexible film is placed directly under the contact terminals, where the film contact surface is the opposite surface free of such traces. By this arrangement, there is no ohmic, i.e. metal-to-metal, contact between the contact terminals and traces on the film, whereby energy is capacitively coupled from one or a pair of terminals to a second or different pair of terminals in a manner that reduces differential mode crosstalk.

BRIEF DESCRIPTION OF DRAWINGS

FIGS. 5-7 are plan views of the thin capacitive inserts for use in the embodiment of FIGS. 1 and 2, where FIG. 7 shows one insert overlying a second insert as used in the embodiment of FIG. 1.

FIG. 8 is a plan view of a single flexible film insert, prior to folding into U configured manner, for use in the embodiment of FIGS. 3 and 4.

DETAILED DESCRIPTION OF PREFERRED EMBODIMENT

This invention is directed to an electrical connector which utilizes an electronic device, preferably in the form of a flexible film having a multiplicity of discrete circuit traces along a surface thereof, where the film is placed adjacent to the plural arrays of electrical contacts within such connector, the traces are on a film surface not in contact with the electrical contacts i.e. isolated by the film body from the contacts, to achieve the enhanced performance needed to exceed Category 5 requirements.

Figure 1:
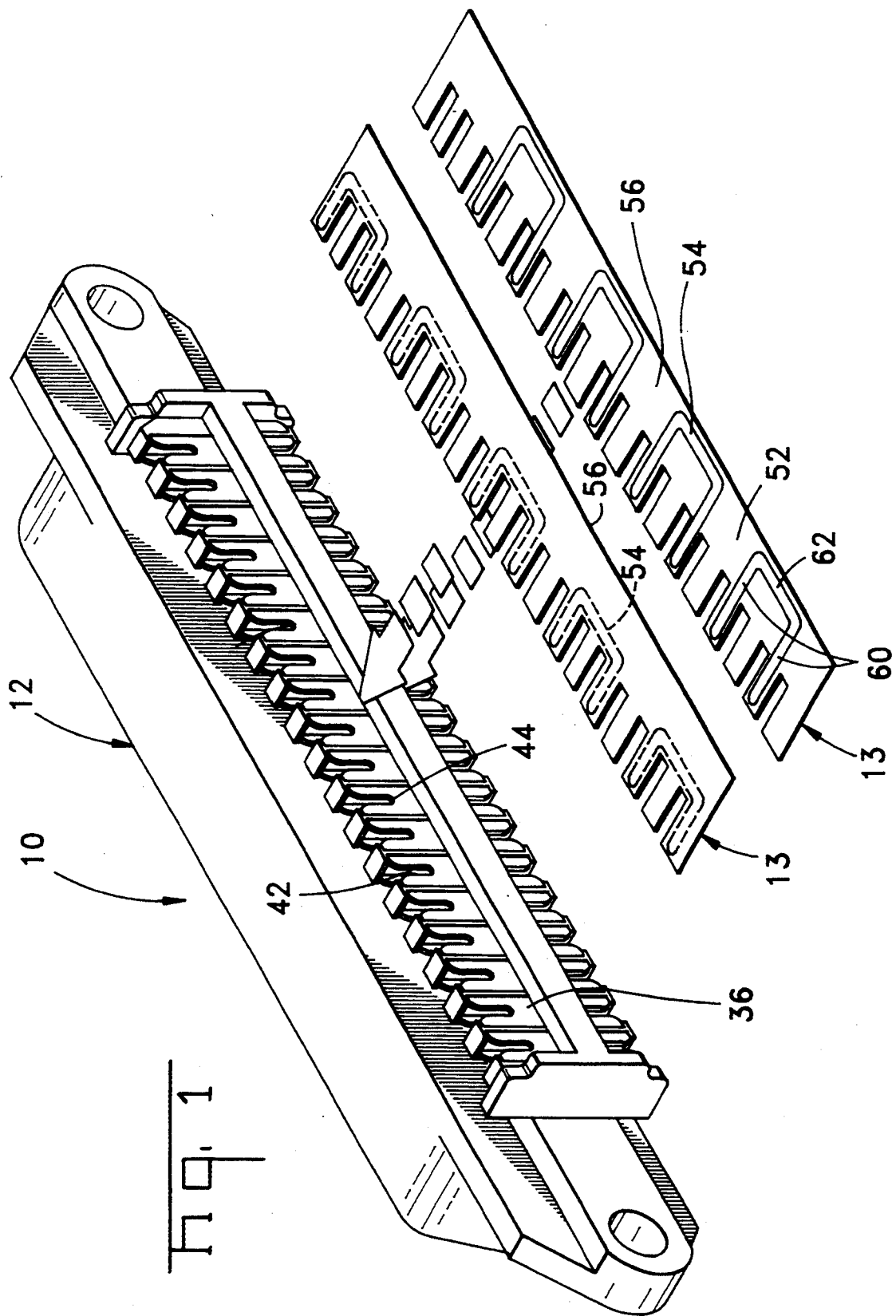
FIG. 1 is a partially exploded perspective view of an electrical connector housing with contact terminals which utilize capacitive coupling through non-ohmic contact by the teachings of this invention, where thin inserts, such as flexible film, having a pattern of discrete electrical traces along a first surface thereof, are placed directly under the contact terminals, as indicated by the direction arrows.
Figure 2:
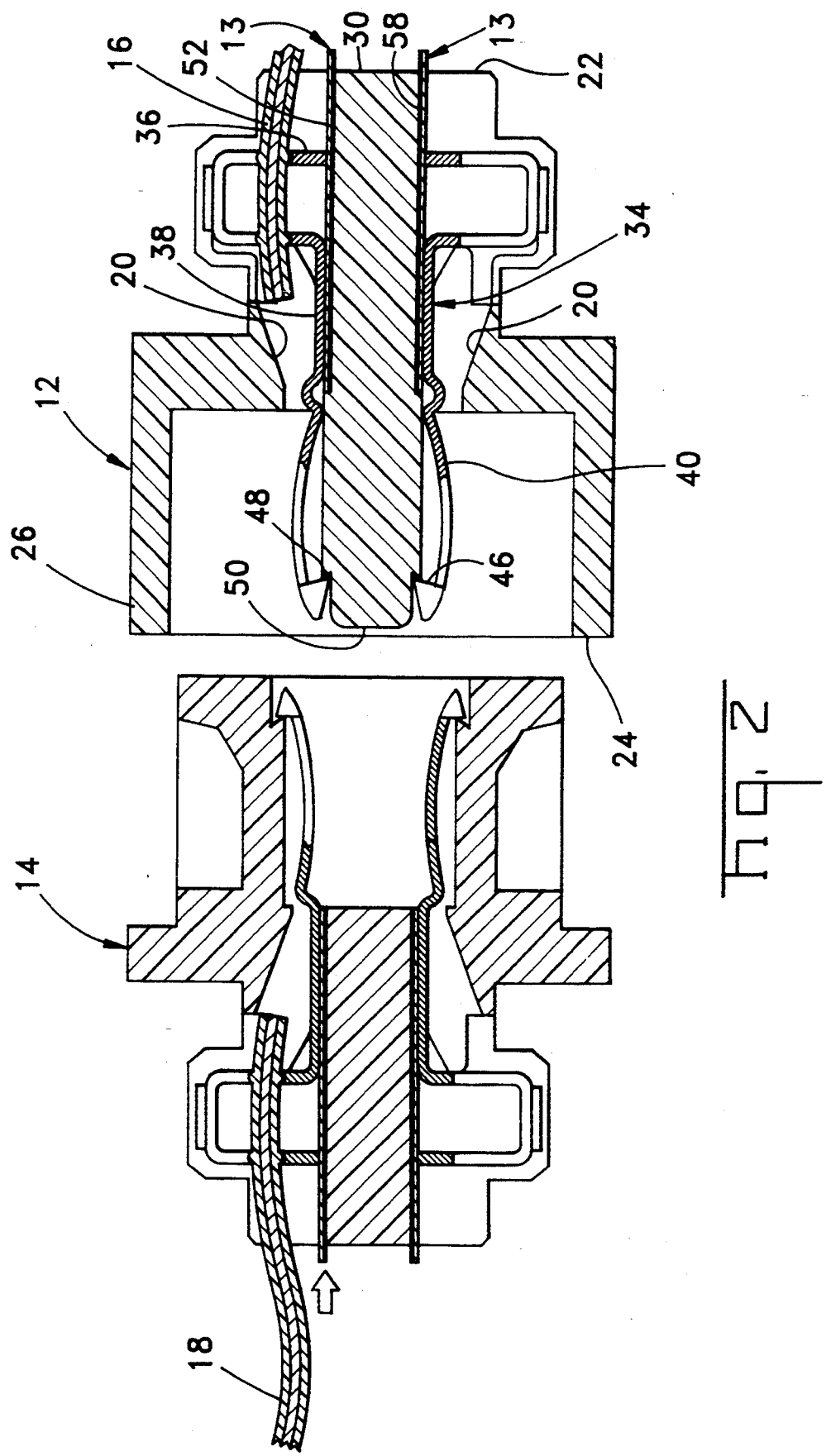
FIG. 2 is a longitudinal sectional view of a pair of intermatable connector housing members modified by the invention hereof to meet or exceed Category 5 requirements.

FIGS. 1 and 2 represent a first embodiment of a typical multi-contact electrical connector 10 which utilizes a pair of specially designed electronic devices 13 or flexible films to achieve the high performance desired.

Referring now in more detail to the Figures, a multi-contact electrical connector in accordance with a preferred embodiment of this invention is disclosed. The connector 10 typically comprises a pair of intermatable connector members 12, 14 such as a plug and receptacle, as known in the art. As will be apparent from the description below, both of these connector members contain a plurality of contact terminals which are electrically and mechanically connected to individual conductors or wires contained in cables 16, 18. When the connector members 12, 14 are coupled to each other the conductors in the cables will then be connected to each other. Though only one connector member will be described in detail, it should be understood that the complementary connector member operates in a similar manner.

The connector housing member 12, illustrated in the Figures, but without the cable 16 in FIG. 1, comprises a dielectric housing of a suitable plastic, having plural arrays of cavities 20 extending from a conductor receiving side 22 to a connector mating side 24. The mating side 24, for the connector housing member 12, includes an encircling shroud 26 for matably receiving therein connector housing member 14.

The embodiment of the Figures illustrates the connector 10 as having a plurality of cavities 20 arranged in two parallel rows and are identical to each other, although the cavities of the lower row are inverted relative to the cavities of the upper row. Between such parallel rows of cavities, a dielectric wall 30 typically is found.

Each cavity 20 contains a pre-loaded electrical contact terminal 34 slidably received therein, where the terminal comprises a rearward conductor connecting section 36, a shank portion 38, and a contact portion 40. The conductor connecting section 36 is generally U-shaped and has an opening 42 extending into the bight of the U. This opening communicates with slots 44 in each leg of the U which have a width somewhat less than the diameter of the conducting core of the conductor to which the terminal is to be connected. As known in the art, the manner of terminating the various conductors of cable 16 to the contact terminal 34, particularly the conductor connecting portion 36, is insulation displacement, or IDC. In the embodiment of FIG. 2, the contact portion 40 is illustrated as bowed terminating in a latching barb 46 which is adapted to engage a complementary shoulder 48 at the mating end 50 of dielectric wall 30. By this arrangement, the contact terminals are fixed within the housing member, particularly during mating with the complementary housing member 14.

Disposed between the dielectric wall 30, and the arrays of contact terminals, are a pair of electronic devices 13 in the form of a thin flexible film 52 having discrete traces 54 of electrical circuitry along a surface 56 that lies adjacent to the wall 58 of dielectric wall 30, see FIG. 2, where the preferred system includes a continuous film portion having plural fingers extending laterally therefrom along one or both of the major edges. By this arrangement, the discrete traces are in close proximity to the contact terminals, but not in ohmic contact therewith. As illustrated in embodiment of FIGS. 2 and 5-7, the discrete traces 54 are a series of adjacent "U's" extending from one said finger to another. Each trace includes a pair of axially arranged arms 60 joined together by a lateral arm 62. The respective arms 60 of a given trace 54 are positioned to underlie alternate contact terminals 34. In operation, though the traces 54 are electrically insulated from the contact terminals 34 by virtue of the film body, i.e. non-ohmic contact, the discrete traces 54 are positioned to receive an induced EMF from the respective contact terminals 34.

A type of flexible film contemplated by this invention may comprise a thin flexible polyamide film on which the traces are formed, such as etched copper traces. A suitable film thickness for practicing this invention is on the order of about 10 to 12 mils. However, there are other known procedures for forming such traces on the flexible film.

Figure 3:
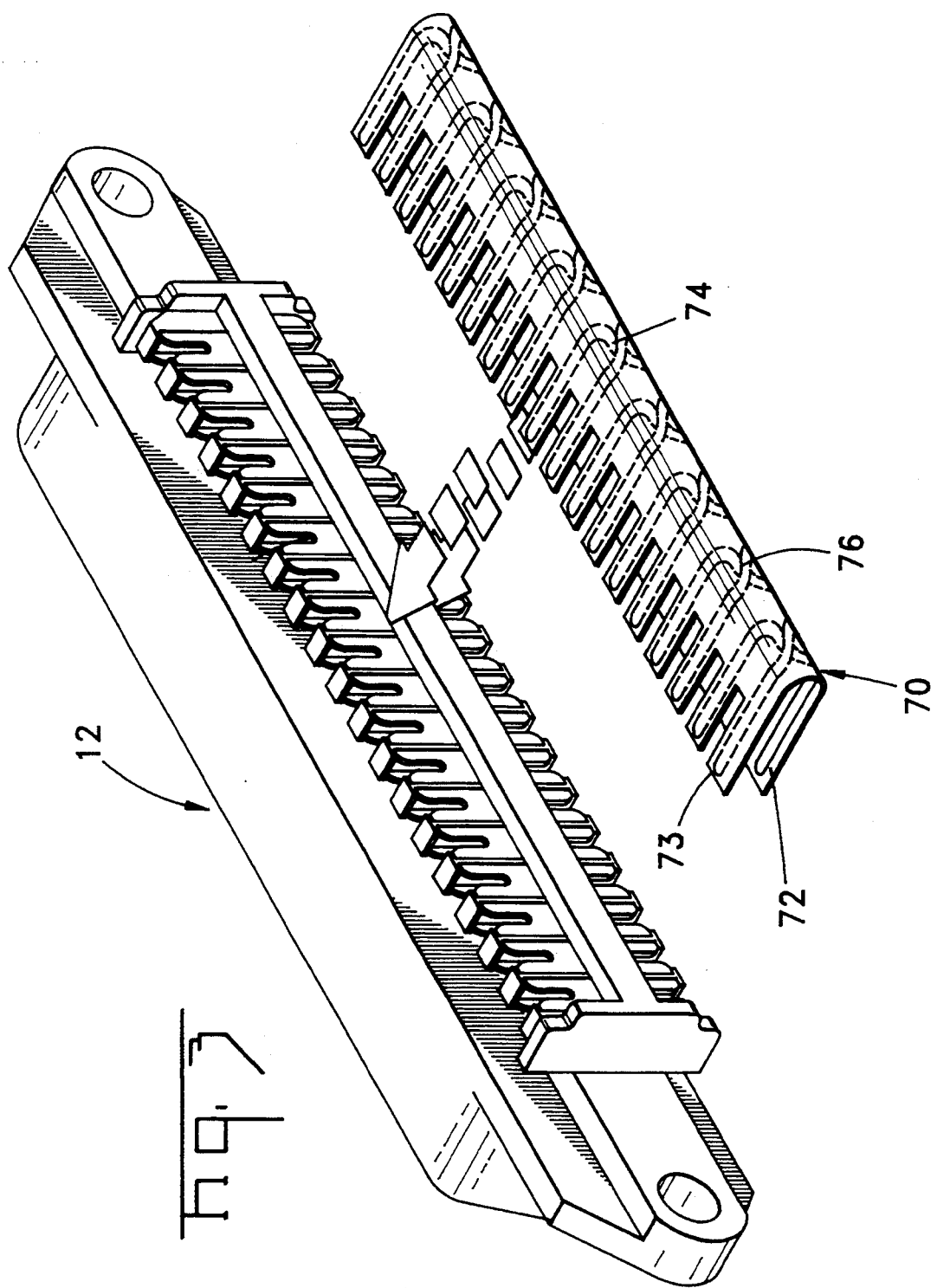
FIG. 3 is a partially exploded perspective view of an electrical connector housing with contact terminals, similar to FIG. 1, where the improved performance is achieved by the use of a single flexible film insert placed in non-ohmic contact with the terminals.
Figure 4:
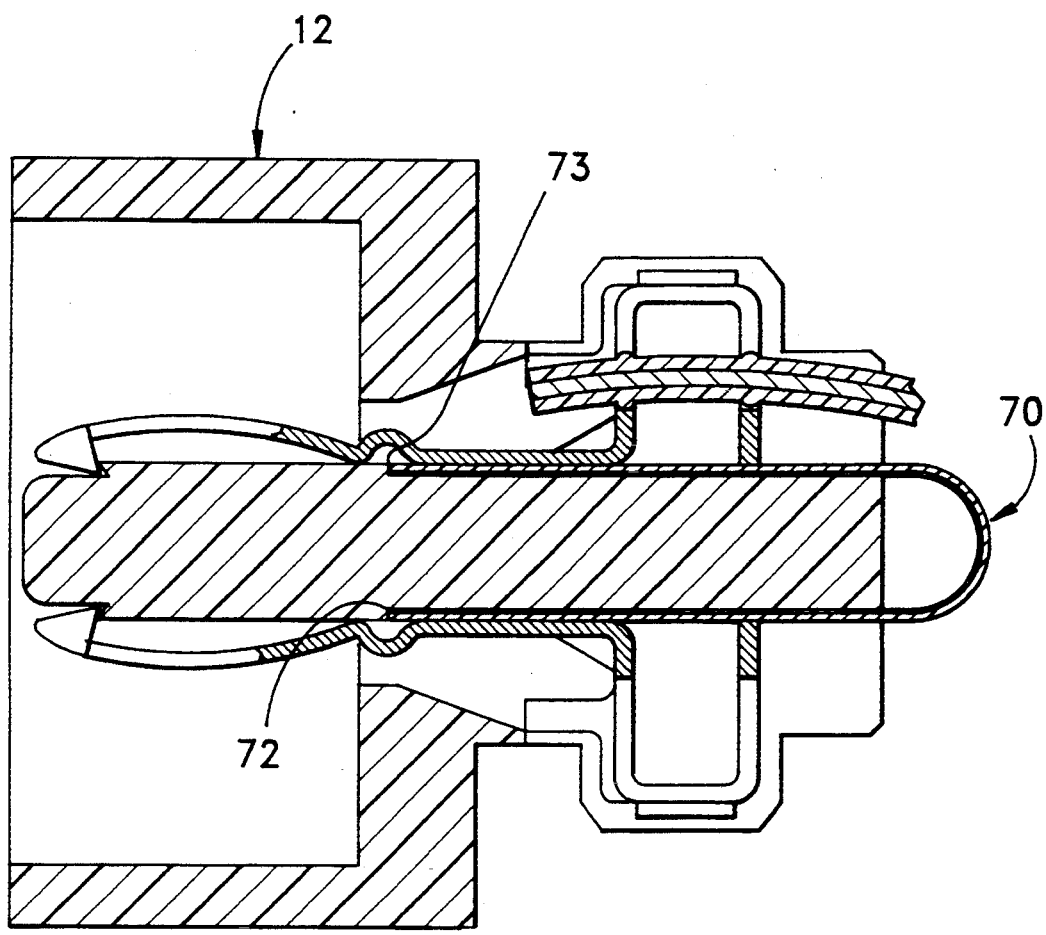
FIG. 4 is a longitudinal sectional view of a single connector housing member taken transversely of the connector of FIG. 3.

FIGS. 3 and 4 represent an alternate embodiment where a single electronic device 70, in the form of a single U-configured flexible film has its respective ends 72,73 disposed within the cavities 20 adjacent the contact terminals 34. As best seen in FIG. 3, the traces 74 extend from end 72 to end 73, with a non-contact crossover 76. By this arrangement an upper contact terminal, for example, is non-ohmically coupled to a lower contact terminal.

Whether one selects the single electronic device of FIGS. 3, 4, and 8, or the plural devices of FIGS. 1, 2, and 5–7, a common feature thereof is the imposition of a conductive material on a dielectric material, situated where the dielectric material is between the conductive material and the signal-carrying conductors of the connector between which additional coupling is desired. In any case, it is important to note that this technique differs from other approaches of the prior art in which an additional trace is a branch from a signal-carrying trace. In the present invention the trace would not be a part of an existing signal carrying trace, i.e., it would not be ohmically connected.

As best illustrate by the plan views of FIG. 5–8, the traces are generally discrete traces. The traces are positioned so that energy is coupled from one conductor of a pair to one conductor of a second pair in a manner that compensates for imbalances in coupling that are inherent in the existing connector. The method of compensation may be either through better balancing of the coupled signals, or through intentional unbalancing as described in U.S. Pat. No. 5,341,419, by the inventor hereof, the description of which is also incorporated herein by reference.

In any case, the capacitive coupling, as illustrated in FIGS. 2 and 4, may be carried out in the plug, the receptacle, or both. The trace pattern on the electronic device 13,70 can be chosen so that energy is coupled from a single conductor of a pair to a single conductor of a second pair within an array, or coupled between two conductors in different arrays of contact terminals. FIG. 8 illustrates a planar electronic device 70, which when folded along the lines 80,82, can be inserted into the connector 12 to couple one conductor from the upper array of terminals to the lower array.

I claim:

1. In a multi-contact electrical connector comprising a pair of intermatable connector members, where each said connector member is adapted to be terminated to plural conductors, and each said commuter member comprises a housing formed of an insulative material and having a conductor receiving side and a mating side, a plurality of contact receiving cavities extending from said conductor receiving side to said mating side, said cavities being arranged in rows on spaced-apart parallel axes, where adjacent rows are separated by an insulative housing wall, and an array of electrical contact terminals mounted in said cavities, each of said contact terminals having contact means at its forward end proximate to said mating side and conductor terminating means proximate to said conductor receiving side, the improvement comprising in combination therewith the provision of incorporating an electronic device between the insulative housing wall and said contact terminals mounted within said cavities, said electronic device comprising a thin dielectric film having plural discrete electrically conductive traces along a first surface thereof, where said first surface is arranged adjacent said insulative housing wall, whereby selected pairs of said contact terminals are non-ohmically coupled together via said conductive traces to improve connector performance through capacitive coupling of energy between said selected pairs of said contact terminals.

2. The electrical connector according to claim 1, wherein said film has a thickness of about 10 to 12 mils.

3. The electrical connector according to claim 1, wherein there are two rows of said cavities separated by said insulative housing wall, and said electronic device is a single film whose respective ends are inserted between the respective contact terminals and said insulative housing wall.

4. The electrical connector according to claim 1, wherein said electronic device includes a continuous edge portion having plural fingers extending laterally therefrom, and that said discrete electrically conductive traces extend from a pair of said fingers and are joined within said edge portion.

5. The electrical connector according to claim 3, wherein said electronic device includes a continuous central portion having plural fingers extending laterally from each side thereof, and that said discrete electrically conductive traces extend from a said finger along one side to a said finger along the opposite side.

6. The electrical connector according to claim 5, wherein certain adjacent said traces crossover in a non-contact relationship in said central portion.

7. The electrical connector according to claim 5, wherein there are two rows of said cavities separated by said insulative housing wall, and that two said electronic devices are placed respectively between one said array of contact terminals and said insulative housing wall, and that the respective traces are vertically staggered between the two electronic devices.

* * * * *